United States Patent [19]

Webster et al.

[11] Patent Number: 4,996,116
[45] Date of Patent: Feb. 26, 1991

[54] ENHANCED DIRECT BOND STRUCTURE

[75] Inventors: Harold F. Webster, Scotia; Constantine A. Neugebauer; James F. Burgess, both of Schenectady, all of N.Y.

[73] Assignee: General Electric Company, Schenectady, N.Y.

[21] Appl. No.: 454,547

[22] Filed: Dec. 21, 1989

[51] Int. Cl.$^5$ .................... B32B 15/00; B32B 15/04
[52] U.S. Cl. .................... 428/627; 428/632; 428/639; 428/664; 428/669; 428/670; 428/672; 428/674

[58] Field of Search .............. 228/263.18, 263.12, 228/208, 209, 122, 123, 124; 428/672, 671, 673, 670, 669, 627, 663, 664, 674, 665, 632, 639

[56] References Cited

U.S. PATENT DOCUMENTS

| | | | |
|---|---|---|---|
| 3,006,069 | 10/1961 | Rhoads et al. | 228/208 |
| 3,147,547 | 9/1964 | Kuebrich et al. | 428/672 |
| 3,160,798 | 12/1964 | Lootens et al. | 428/672 |
| 3,273,979 | 9/1966 | Budnick | 428/672 |
| 3,593,412 | 7/1971 | Foote | 228/209 |
| 3,744,120 | 7/1973 | Burgess et al. | 228/198 |
| 3,766,634 | 10/1973 | Babcock et al. | 29/471.29 |
| 3,854,892 | 12/1974 | Burgess et al. | 29/196.1 |
| 3,911,553 | 10/1979 | Burgess et al. | 228/903 |
| 3,993,411 | 11/1976 | Babcock et al. | 228/903 |
| 3,994,430 | 11/1976 | Cusano et al. | 357/81 |
| 4,023,725 | 5/1977 | Ivett et al. | 228/208 |
| 4,076,711 | 3/1978 | Bell et al. | 228/263.12 |
| 4,129,243 | 12/1978 | Cusano et al. | 228/122 |
| 4,356,512 | 11/1982 | Richten | 428/672 |
| 4,409,278 | 10/1983 | Jochym | 428/163 |
| 4,563,383 | 1/1986 | Kuneman et al. | 428/216 |
| 4,567,110 | 1/1986 | Jarvinen | 228/124 |
| 4,693,409 | 9/1987 | Mizunoya et al. | 228/124 |
| 4,727,633 | 3/1988 | Herrick | 228/263.18 |
| 4,750,665 | 6/1988 | Falanga | 228/263.12 |
| 4,811,893 | 3/1989 | Kanahara et al. | 228/263.18 |

OTHER PUBLICATIONS

Y. S. Sun et al., "A New Hybrid Power Technique Utilizing a Direct Copper to Ceramic Bond", IEEE Transactions on Electron Devices, vol. E2-23, No. 8, Aug. 1976, pp. 961-967.

J. F. Burgess et al., "The Direct Bonding of Metals to Ceramics by the Gas-Metal Eutectic Method", J. Electrochem. Soc., (U.S.A.), vol. 122, No. 5, May 1975, pp. 688-690.

Temple, V. A. K. et al., U.S. patent application Ser. No. 07/375,636 filed Jul. 3, 1989, entitled "Hermetic Package and Packaged Semiconductor Chip Having Closely Spaced Leads Extending Through the Package Lid".

Primary Examiner—John J. Zimmerman
Attorney, Agent, or Firm—Marvin Snyder; James C. Davis, Jr.

[57] ABSTRACT

A direct (metal-metal compound eutectic) bond process is improved by disposing a eutectic/substrate-wetting enhancement layer on the substrate prior to performing the direct bond process to bond a metal foil to the substrate. Where the metal is copper, the direct bond process is rendered more effective than prior art direct bond processes on alumina and beryllia and makes the direct bond process effective on tungsten, molybdenum and aluminum nitride, all of which were unusable with the prior art direct bond copper process. A variety of new, useful structures may be produced using this process. The eutectic/substrate-wetting enhancement layer is preferably a noble-like metal or includes a noble-like metal such as platinum, palladium and gold.

49 Claims, 4 Drawing Sheets

ENHANCED DIRECT BOND STRUCTURE

RELATED APPLICATIONS

This application is related to application Ser. No. 07/454,548, filed concurrently herewith, and entitled, "Ceramic-to-Conducting-Lead Hermetic Seal" by Harold F. Webster. That application is incorporated herein by reference.

BACKGROUND OF THE INVENTION

FIELD OF THE INVENTION

The present invention relates to the field of metal bonds, and more particularly, to the field of direct (metal-metal compound eutectic) bonds.

BACKGROUND INFORMATION

A direct bonding process in which a metal-metal compound eutectic bonds the metal to a ceramic member or to the same metal is disclosed and described in U.S. Pat. Nos. 3,744,120, 3,854,892 and 3,911,553 to Burgess et al.; U.S. Pat. Nos. 3,766,634 and 3,993,411 to Babcock et al.; U.S. Pat. Nos. 3,994,430 and 4,129,243 to Cusano et al.; U.S. Pat. No. 4,409,278 to Jochym; and U.S. Pat. No. 4,563,383 to Kuneman et al. Each of these patents is incorporated herein by reference. The direct bond is formed by a metal-metal compound eutectic mixture which wets both metal and ceramic materials such as alumina and beryllia at the elevated bonding temperature and which bonds the metal and the ceramic or metal together upon solidification. These direct bond patents teach the use of a variety of metal-metal compound eutectic combinations including copper-copper oxide, nickel-nickel oxide, cobalt-cobalt oxide, iron-iron oxide and copper-copper sulfide. This process employing a copper-copper oxide eutectic has been in use for many years in the electronics arts and particularly in the ceramic package art.

The copper-copper oxide eutectic bond taught in these patents has been widely used to bond copper to alumina or beryllia substrates and to bond copper to copper, all for use in electronic systems. Satisfactory, thermally-conducting bonds are routinely obtained between copper and copper, copper and alumina and copper and beryllia. The copper-copper bond is also highly electrically conductive.

However, there are a number of other substrates to which it would be desirable to form such bonds including tungsten, tungsten-rhenium alloys, molybdenum, aluminum nitride, silicon carbide, diamond and so forth, none of which are susceptible to the copper-copper oxide eutectic bonding process disclosed in the above-identified direct bond patents because the copper-copper oxide eutectic does not adhere to these substrates and thus cannot form a eutectic bond.

These additional substrates are considered desirable for use in the electronics arts because of their relatively high thermal conductivity and relatively low thermal coefficients of expansion which closely match silicon and other materials to which it has long been desired to form bonds for thermal conduction purposes in combination with electrical insulation or electrical conductivity in accordance with the electrical conductivity of the specific substrates.

A direct bond between copper and aluminum nitride would be particularly desirable since it would facilitate use of aluminum nitride as an insulating substrate for the packaging of silicon semiconductor devices. The desirable characteristics of aluminum nitride include its thermal coefficient of expansion of $4.6 \times 10^{-6}/^\circ$ C. which closely matches silicon's thermal coefficient of expansion of $3.0 \times 10^{-6}/^\circ$ C. and its high thermal conductivity. Copper has a thermal conductivity of $398 W/m^\circ K$., beryllia (whose powder form is toxic) has a thermal conductivity of $240 W/m^\circ K$., aluminum nitride has a thermal conductivity of substantially $185 W/m^\circ K$., silicon has a thermal conductivity of $85 W/m^\circ K$. and 96% pure alumina ceramic has a thermal conductivity of $29 W/m^\circ K$. Thus, these materials rank in the following order from most thermally conductive to least thermally conductive: copper, beryllia, aluminum nitride, silicon and alumina.

The electronics industry has devoted substantial effort to attempts to form strongly adherent metal claddings on aluminum nitride. Unfortunately, metal to aluminum nitride adhesion has been a major problem which has not been satisfactorily solved. There is no presently known process which enables the formation of a good mechanical bond between a conducting layer and aluminum nitride in which the bond exhibits high thermal conductivity. While copper-clad aluminum nitride is available in the industry, it is produced by an elaborate, expensive process which creates an oxide interface layer between the aluminum nitride and the copper metal which has low thermal conductivity. The copper-clad aluminum nitride is not in common use because of its cost and reduced thermal conductivity. This reduces the desirability of the clad aluminum nitride as a thermally conducting substrate.

Further, while acceptable bonds are formed between copper and alumina using this direct bond process, a substantial area of direct bond between copper and alumina is required in order to ensure the formation of a hermetic seal. In particular, a span of 100 mils (2.54 mm) has been found necessary to ensure the formation of a hermetic seal between the direct bond copper and the alumina. While such large expanses are acceptable where the copper/alumina bond is being formed primarily for heat conductivity, such a large expanse is a disadvantage in applications where a narrow hermetic seal is desired such as in a seal between a package lid and a package base or in sealing a lead passing through a ceramic package member as taught in patent application Ser. No. 375,636, filed July 3, 1989, entitled "Hermetic Package and Packaged Semiconductor Chip Having Closely Spaced Leads Extending Through the Package Lid" by V.A.K. Temple et al.

Further, where copper is direct bonded to alumina, the edges of the copper are often not securely bonded to the alumina with the result that the edge can be lifted by picking or by catching on other objects. While this generally does not result in separation of the entire copper foil from the alumina substrate, it is a disadvantage in many situations.

Accordingly, there is a need for an improved direct bonding process which results in a more secure bond between copper and alumina and in the ability to bond copper to additional substrates for which present direct bond copper processes do not work.

OBJECTS OF THE INVENTION

Accordingly, a primary object of the present invention is to provide an improved direct bond process which is usable with more substrates.

Another object of the present invention is to provide improved wetting between a metal-metal compound eutectic and a substrate to provide an improved bond or a previously unachievable bond.

Another object of the present invention is to provide improved wetting between a copper-copper oxide eutectic and a substrate to provide an improved bond or a previously unachievable bond.

A further object of the present invention is to provide a direct bond between copper and aluminum nitride which has high thermal conductivity.

A further object of the present invention is to provide a eutectic/substrate-wetting enhancement layer which may be disposed on a substrate prior to direct bonding to enhance or make possible the formation of a direct metal-metal compound bond between the metal and that substrate.

SUMMARY OF THE INVENTION

The above and other objects which will become apparent from the specification as a whole, including the drawings, are accomplished in accordance with a preferred embodiment of the present invention by the formation of a eutectic/substrate-wetting enhancement layer on the substrate prior to performing a direct bonding process to bond a metal to the substrate. This eutectic/substrate-wetting enhancement layer is a noble-like metal, a mixture including one or more noble-like metals or an alloy including one or more noble-like metal which exhibits an appropriately shallow wetting angle between the metal-metal compound eutectic and the eutectic/substrate-wetting-enhancement-layer thereby improving the adhesion of the metal-metal compound eutectic to the substrate. The eutectic/substrate-wetting enhancement layer may preferably be a relatively thin layer and can be as thin as 2000 angstroms or thinner.

This eutectic/substrate-wetting enhancement layer may be formed by any process which is appropriate to the enhancement layer composition and the substrate on which it is formed. Thus, the eutectic/substrate-wetting enhancement layer may be formed by evaporation, sputtering, diffusion bonding, electroless plating, electroplating, decomposition of a source or precursor compound, rolling or other techniques in accordance with the composition and physical characteristics of the substrate. Following formation of the eutectic/substrate-wetting enhancement layer on the substrate, a metal foil or member may be prepared for direct bonding by the formation of a thin layer of the metal compound of the eutectic composition on the surface thereof and placed in contact with the eutectic/substrate-wetting enhancement layer. The combined structure is then run through a direct bonding temperature profile for the desired eutectic composition in an appropriate atmosphere for the formation of the eutectic, as taught in the above-cited direct bonding patents. After the liquid eutectic forms, the combined structure is cooled to solidify the eutectic and complete the bond.

The resulting eutectic bond has a low wetting angle which indicates thorough wetting of the eutectic/substrate-wetting enhancement layer by the metal-metal compound eutectic. In the case of a copper-copper oxide eutectic bond the eutectic/substrate-wetting enhancement layer may preferably be a relatively thin film or layer selected from the group consisting of platinum, palladium, gold and platinum, palladium or gold containing mixtures or alloys which exhibit an appropriately shallow wetting angle to the metal-metal compound eutectic. This securely bonds the copper to the alumina, including along the edges of the copper, thereby eliminating the problem of picking and catching the edges of the copper foil. In the case of a copper-copper oxide eutectic bond to aluminum nitride, a bond is formed with a strength which is comparable to the strength of the aluminum nitride itself.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

Figure 1:
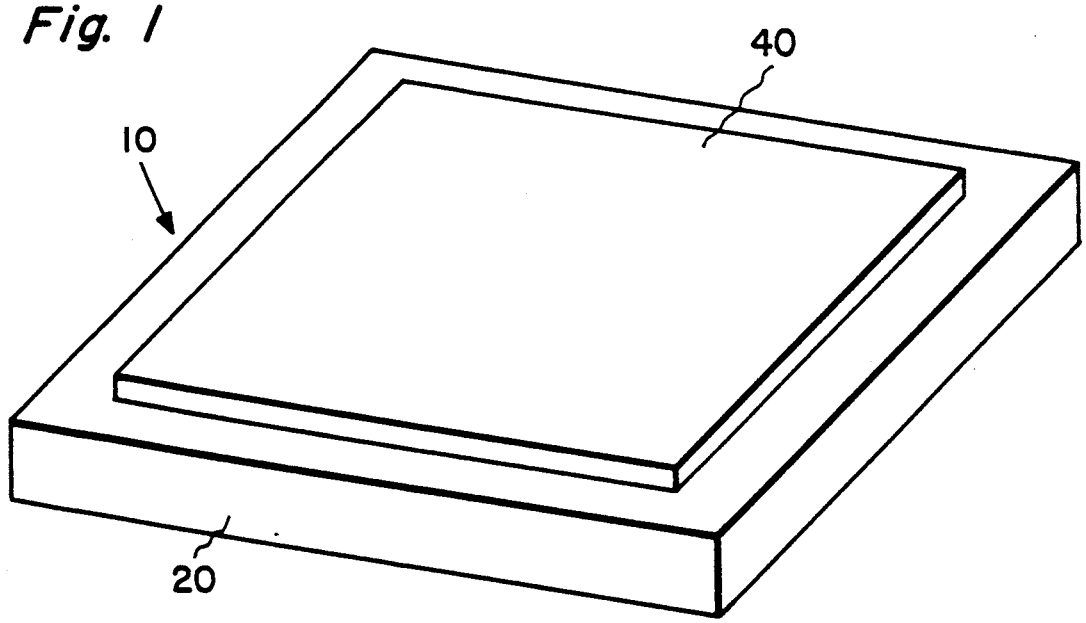
FIG. 1 is a perspective view of a copper foil bonded to an alumina substrate in accordance with the prior art direct bond process.

A prior art copper/alumina composite formed by the direct bond copper process is illustrated generally at 10 in FIG. 1. The composite comprises an alumina substrate 20 and a copper foil 40 direct bonded by a copper-copper oxide eutectic to the upper surface of the alumina substrate 20. The copper foil 40 is smaller in lateral dimensions than the alumina substrate 20 and is set back from the edges of the substrate. As may be seen in the figure, the edges and corners of the foil 40 are substantially square, having been largely unaffected by the direct bonding process because of the steep wetting angle produced by that process which results from marginal wetting and results in the substantial direct bond distance (~100 mils) required to ensure a hermetic seal between the copper foil 40 and the alumina substrate 20. Portions of the edge of the copper foil 40 are often subject to picking or lifting if snagged on some other object because of the direct bond's steep wetting angle at the edge of the copper and marginal adhesion at that location.

Figure 2:
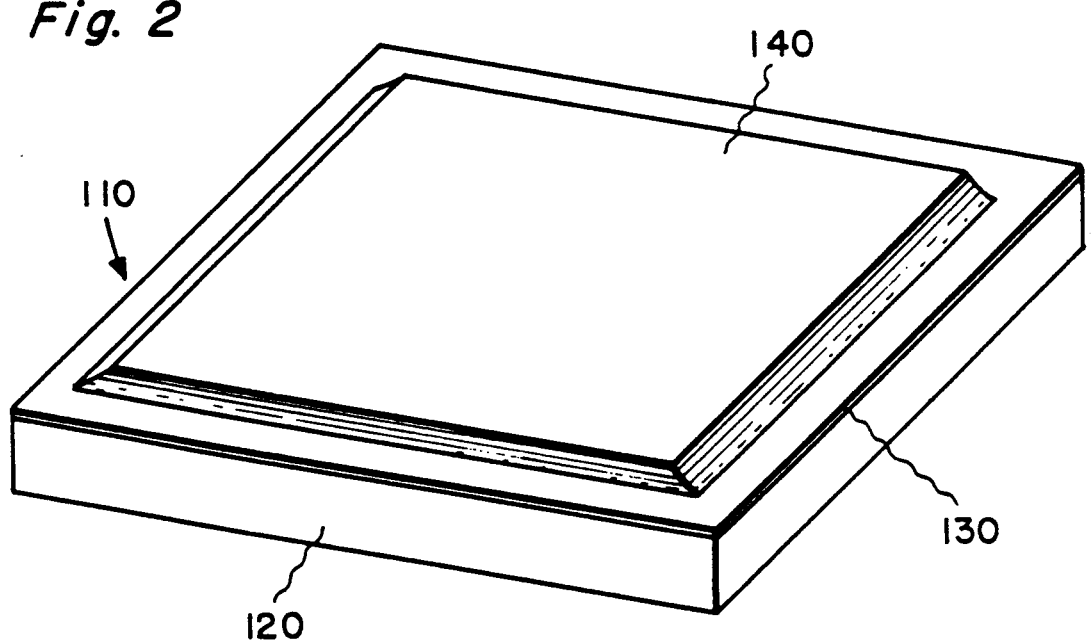
FIG. 2 is a perspective illustration of a copper foil bonded to a substrate in accordance with the present invention.

A metal/substrate composite in accordance with the present invention is illustrated generally at 110 in FIG. 2. This composite comprises a substrate 120 having a eutectic/substrate wetting-enhancement layer 130 disposed on the upper surface thereof and a metal foil 140 direct bonded to the eutectic/substrate-wetting enhancement layer and thus to the substrate. The substrate 120 may be alumina, beryllia, aluminum nitride, tungsten, tungsten-rhenium alloys or molybdenum or mixtures thereof. The eutectic/substrate-wetting enhancement layer 130 must form a bond to the substrate 120 by the technique used to deposit the enhancement layer 130. Where the substrate is alumina, beryllia or aluminum nitride, this deposition will normally be by sputtering, evaporation, thermal or optical decomposition of organometallic compounds, thick film deposition or other techniques which do not risk fracturing these relatively fragile substrate materials. Where the substrate is tungsten or molybdenum, these same deposition methods may be employed. In addition, such methods as electroless plating and electroplating may be employed as may rolling together a foil of the enhancement layer material and the substrate to form a secure bond therebetween, since the substrate material is not fragile or brittle and subject to cracking. However, rolling is not preferred because of the very thin eutectic/substrate-wetting enhancement layers which provide satisfactory results and the relatively high cost of the eutectic/substrate-wetting enhancement layer material. Those skilled in the art will be able to determine appropriate deposition or coating processes for the combination of the wetting-enhancement layer and the particular substrate material and/or configuration.

With an alumina substrate, the wetting angle of the copper foil in the presence of the eutectic/substrate-wetting enhancement layer becomes a shallow wetting angle which provides firm adhesion of the metal foil along all its edges to the wetting-enhancement layer 130 and thereby to the underlying substrate 120. The adhesion of the direct bond copper to the substrate is limited by the adhesion of the wetting enhancement layer to the substrate. Since the wetting enhancement layer has excellent adhesion, this eliminates the problem of the metal foil 140 catching or snagging on other objects and being lifted from the substrate 120. Further, the metal foil 140 is more securely bonded to the substrate 120, in that when one tries to pick a corner of it up to pull it off the copper foil is extremely difficult to pick and if picked, requires additional force to peel it off the substrate. In contrast, in the prior art direct bond process, a copper foil is more easily lifted, especially in the vicinity of its edges. Thus, the wetting-enhancement layer substantially improves the prior art direct bond process. Further, the direct bond distance required to form a hermetic seal is greatly reduced as compared to the prior art process. A direct bond length of as little as 25 mils (~630 microns) being sufficient to form a hermetic seal.

The copper-copper oxide eutectic direct bonding examples discussed in this specification were carried out in a belt furnace which is 9 feet (2.74 meters) long, has a belt 4 inches (10.2 centimeters) and an entrance gate or aperture 2.5 inches (6.35 centimeters) high. The heat-up zone of this furnace is substantially 2.5 feet (76 centimeters) long in which the temperature ramps from an ambient temperature of 20° C. to a temperature of 1066° C. The eutectic bonding zone (that portion of the furnace at a temperature greater than 1,065° C.) is substantially 2 feet (61 centimeters) long and the cool-down zone of the furnace is substantially 4.5 feet (137 centimeters) long in which the temperature ramps from 1066° C. to near ambient temperature. The total transit time for a part in this furnace is 35 minutes and the part remains at the liquid eutectic temperature for substantially 7 minutes and 48 seconds in passing through the furnace. The furnace has a nitrogen atmosphere and thus does not provide the oxygen necessary for the formation of a copper-copper oxide eutectic. Consequently, we pre-oxidize the copper member or foil at a temperature of 340° C. in air for a period of several minutes prior to assembly of the composite for its pass through the direct bond furnace.

In our work with this improved direct bond process, we have found that platinum as the eutectic/substrate-wetting enhancement layer provides truly superior results while palladium as the eutectic/substrate-wetting enhancement layer provides improved wetting, but does not result in as shallow a wetting angle and forms a less tenacious bond between the foil and the substrate. Gold is similar to platinum. The eutectic/substrate-wetting enhancement layer in accordance with this invention may be substantially pure platinum, substantially pure palladium, substantially pure gold, or mixtures or alloys containing sufficient platinum, palladium or gold or mixtures of some or all of them to produce a sufficiently shallow wetting angle to the metal-metal compound eutectic to achieve the desired direct bond. In the cases of tungsten and molybdenum, even a fairly steep wetting enhancement layer is serving as a barrier layer to prevent oxygen scavenging by the substrate as is discussed below.

Our analysis of the copper-copper oxide eutectic layer on platinum on alumina by x-ray analysis did not disclose the presence of platinum in the copper-copper oxide eutectic. Consequently, the success of this process seems to be primarily a result of a high affinity of the metal-metal compound eutectic for the eutectic/substrate-wetting enhancement layer itself. This conclusion is supported by the finding of a shallow wetting angle between a copper-copper oxide eutectic and a platinum member such as a platinum rod 40 mils (1.02 mm) in diameter.

The prior art direct bond copper process was incapable of forming a bond between the copper and metal substrates such as tungsten, a tungsten-rhenium (W-Re) alloys and molybdenum. With use of a wetting enhancement layer in accordance with the present invention, a strong direct bond is formed between a copper foil and tungsten (W), tungsten-rhenium alloy (W-Re) and molybdenum (Mo) substrates. Our preferred process with W, W-Re and Mo substrates is to sputter a thin eutectic/substrate-wetting enhancement layer of platinum (Pt), palladium (Pd) or gold (Au) on the surface or surfaces of the W, W-Re or Mo on which a direct bond is desired. The eutectic/substrate-wetting enhancement layer may range in thickness from less than about 2000Å to 10,000Å or more. We now believe that one of the reasons that the prior art direct bond process was unsuccessful with these refractory metal substrate materials while the enhanced process in accordance with the present invention is extremely successful, may be that the tungsten or molybdenum substrate has a higher affinity for the oxygen necessary to the formation of the copper-copper oxide eutectic than the copper itself has with the result that a tungsten or molybdenum oxide layer is formed or thickened on the substrate while robbing the copper of the oxygen necessary to form the eutectic liquid which forms the bond in the prior art process. If that is the case, then, in accordance with the present invention, the eutectic/substrate-wetting enhancement layer serves as a barrier layer which prevents the substrate from scavenging oxygen from the copper foil or ambient environment, thereby enabling the formation of the copper-copper oxide liquid eutectic which forms the desired direct bond. Alternatively, it may be a result of a lack of affinity of the substrate material for the metal-metal compound eutectic, while the eutectic/substrate-wetting enhancement layer has affinity for both the substrate and the metal-metal compound eutectic.

Thus, the eutectic/substrate-wetting enhancement layer may alternatively be viewed as a barrier layer which isolates the eutectic liquid from the substrate. While it is preferred that the eutectic/substrate-wetting enhancement layer be platinum, palladium or gold, it will be understood that other materials may be mixed with the platinum, palladium or gold, so long as the low wetting angle for the metal-metal compound eutectic is maintained. Thus, the cost of the eutectic/substrate-wetting enhancement layer may be reduced where that layer comprises platinum, palladium or gold by the addition of other materials which reduce its platinum, palladium or gold content without destroying its eutectic/substrate-wetting enhancement characteristics. Thus, mixtures or alloys of platinum, palladium or gold with other noble-like metals such as nickel which do not form oxides at the direct bond temperatures used under the conditions employed may serve as eutectic/substrate-wetting enhancement layers. Presence of some platinum, palladium or gold in the eutectic/substrate-wetting engancement layer at present seems to be necessary for enhanced wetting with copper-copper oxide eutectic bonding layers in order to achieve the enhanced wetting.

The substrate should be clean before deposition of the wetting enhancement layer to ensure good adhesion. This cleaning may involve degreasing, if necessary. We prefer to back sputter the substrate prior to depositing the the wetting enhancement layer.

In general, any material which forms an adequate bond to the substrate and is bondable by the metal-metal compound eutectic may be used as the eutectic/substrate-wetting enhancement layer.

In an attempt to more fully understand what characteristics of the eutectic/substrate-wetting enhancement layer contribute to the success of this, we coated a copper foil with platinum and disposed that foil on an alumina substrate with the platinum coating disposed toward the alumina. We then ran that composite through the direct bonding temperature profile and atmosphere. No bond was formed between the alumina and the platinum coated copper foil. Consequently, it is preferred to dispose the eutectic/substrate-wetting enhancement layer on the substrate prior to direct bonding. The copper-copper oxide eutectic did not spread from the initial copper location, except for the wetting angle meniscus when a platinum eutectic/substrate-wetting enhancement layer was used with substrates of alumina, beryllia, tungsten, tungsten-rhenium alloys and molybdenum.

One of the benefits provided by use of a tungsten or molybdenum substrate with a eutectic/substrate-wetting enhancement layer and a copper foil direct bond is the ability to produce symmetric bimetallic bodies having a tungsten or molybdenum core with identical copper foil external layers bonded to both sides of the core material. Some of the advantages of such composites are discussed in application Ser. No. 412,052, filed Sept. 25, 1989, entitled "Direct Bonded Symmetric-Metallic-Laminate/Substrate Structures", by C. A. Neugebauer et al. While symmetric bimetallic laminates of copper-molybdenum-copper are available, Applicants are unaware of any presently available copper-tungsten-copper symmetric bimetallic laminate. Thus, the use of the eutectic/substrate-wetting enhancement layer enables the formation of this symmetric bimetallic laminate structure for use in those applications where its particular characteristics are considered desirable. While a eutectic/substrate-wetting enhancement layer could be used to form molybdenum bimetallic laminates, that is not preferred where less expensive methods are available. Such a symmetric bimetallic laminate is shown generally at 200 in FIG. 3. This structure comprises a substrate 220 such as tungsten, two eutectic/substrate-wetting enhancement layers 230 disposed on the upper and lower surfaces of the substrate 220. If desired, these two eutectic/substrate-wetting enhancement layers 230 may be a single continuous layer which extends over the vertical edges of the substrate 220 in the figure to form an overall cladding or coating on the substrate. A pair of symmetric copper foils 240 are direct bonded to the eutectic/substrate-wetting enhancement layers 230 to form the overall composite. This composite structure has a thermal coefficient of expansion in the lateral direction which is intermediate that of copper and the core material (tungsten). Where the wetting layers 230 and the copper foil layers 240 are symmetric about the core 220, this structure will have no tendency to bend upon heating or cooling because of equal stresses applied to both sides of the core by the copper foil layers during heating and cooling as is explained in application Ser. No. 412,052.

While the ability to form such a symmetric bimetallic laminate using tungsten is beneficial, as is the ability to direct bond copper to tungsten and molybdenum, a more surprising and potentially more beneficial result has been obtained with aluminum nitride substrates.

Aluminum nitride substrates were coated on their upper surfaces with a platinum layer ranging in thickness from 2,000Å to 10,000Å (angstroms) or a palladium layer ranging in thickness from 2,000Å to 5,000Å or a gold layer ranging in thickness from 2,000Å to 5,000Å by sputtering. Neither the lowest nor the highest thicknesses listed are limiting. The eutectic/substrate-wetting enhancement layer may be made thinner or thicker, so long as its purpose is still accomplished. Copper foils 3 mils (75 microns) thick were then prepared for direct bonding as described above and placed on top of the platinum, palladium or gold wetting-enhancement layers with the copper foil's oxide coated surface towards the wetting-enhancement-layer-coated surface of the aluminum nitride substrates. These composite structures were then passed through a copper-copper oxide direct bond temperature profile in which they were heated to more than 1,065° C., but less than the 1,083° C. melting temperature of copper and to substantially a temperature of 1066° C. for a period of 7.8 minutes to form the eutectic liquid, after which the structure was cooled to allow the eutectic to solidify. Visual observation revealed some discoloration of the platinum eutectic/substrate-wetting enhancement layer on those portions of the aluminum nitride where no copper was disposed on the platinum on the aluminum nitride. In all cases, the copper foil formed a strong bond to the aluminum nitride and had a low wetting angle typical for the platinum eutectic/substrate-wetting enhancement layer on this substrate. Where a platinum layer covered the entire flat surface of the substrate and the copper foil was substantially smaller than the substrate, the copper-copper oxide eutectic spread beyond the wetting angle meniscus from the original copper foil location by as much as 100 mils (2.54 mm). The thinner platinum layers exhibited less copper spreading than thicker platinum layers. Therefore, eutectic/substrate-wetting enhancement layers less than 2,000Å are usable and desirable in many cases. There is no lower limit on the eutectic/substrate-wetting enhancement layer thickness, other than its effectiveness limit which will depend on deposition conditions and the particular substrate and eutectic/substrate-wetting enhancement layer combination being used. Thus, eutectic/substrate-wetting enhancement layers may range up to about 5,000Å to 10,000Å. Thicker layers may be used, but provide no apparent benefit. Therefore, since the eutectic/substrate-wetting enhancement layers comprise expensive metals, it is preferred to use layers on the order of 2,000Å or thinner. In all cases, a strongly adherent metal cladding was produced on the AlN. This result is obtained without the complexities and expense of the existing processes for cladding aluminum nitride with a conductive layer.

In order to test the adherence of this copper foil layer to the aluminum nitride, the head of a brass screw (head 8 mm in diameter) was soldered to the copper foil near the center of the copper foil. The screw was then pulled in an attempt to pull the copper foil off the aluminum nitride. The foil separated from the bulk of the aluminum nitride by carrying the platinum eutectic/substrate-wetting enhancement layer and some portions of the aluminum nitride with it, thereby micro fracturing the aluminum nitride substrate along the Pt/AlN interface. Thus, the adherence of this direct bond layer to the aluminum nitride was comparable to the coherence of the aluminum nitride with the result that the direct bond interface in accordance with this invention is a secure one. The results were similar with palladium and gold eutectic/substrate-wetting enhancement layers.

This process and the resulting metal-clad aluminum nitride body have broad application to the electronic arts, since the use of aluminum nitride as a substrate material has been considered desirable, but has been prevented by the inability to provide a high adherence bond between a metallic layer and the aluminum nitride. This invention overcomes this obstacle to the use of aluminum nitride as an electronics substrate material.

With substrates of boron nitride and diamond, a successful direct bond was not achieved because of insufficient adherence of the platinum, palladium or gold eutectic/substrate-wetting enhancement layer to the substrate material. This resulted in the copper/wetting-enhancement layer combination separating from the substrate. Use of adhesion promoting chemical or physical treatment of the substrates, or inclusion of an adhesion promoting layer between the substrate and the eutectic/substrate-wetting enhancement layer may overcome this adherence problem. With silicon carbide substrates, no bond was formed because a strong interaction between the silicon carbide and the copper destroyed the copper plate. Use of a more effective barrier layer between the silicon carbide and the copper plate may overcome this problem. Such a layer may preferably be formed on the silicon carbide prior to deposition of the eutectic/substrate-wetting enhancement layer or by adjustment of that deposition process. Thus, while the discussion to this point has been in terms of the eutectic/substrate-wetting enhancement layer being disposed directly on the desired substrate material, it will understood that any intervening layers considered desirable or necessary may be disposed between the primary substrate material and the eutectic/substrate-wetting enhancement layer so long as a bond having desired properties results. In that situation, the primary substrate and its intervening coating layers may be viewed as the substrate on which eutectic/substrate-wetting enhancement layer is disposed.

It will be understood that a primary objective of forming the composite of the copper foil direct bonded to the substrate material is for the purpose of being able to bond other materials or objects to the substrate. One primary application of this structure is for the bonding of semiconductor chips or wafers to the substrate by soldering or other means of securing the chip to the copper foil.

Figure 4:
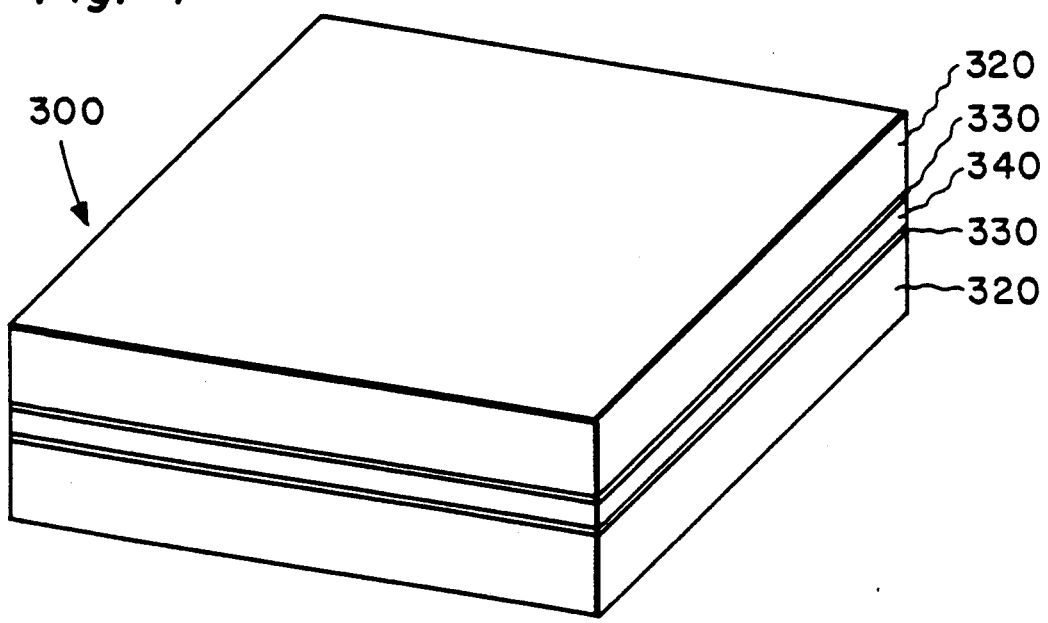
FIG. 4 is a perspective illustration of two substrates bonded to each other via eutectic/substrate-wetting enhancement layers disposed thereon in combination with metal-metal compound eutectic bonds to a central metal foil.

It will also be recognized that this technique may be used to form a composite structure having two "substrates" direct bonded to each other. Such a structure is shown generally at 300 in FIG. 4. In FIG. 4, a lower "substrate" 320 has a eutectic/substrate-wetting enhancement layer 330 disposed on its upper surface and an upper "substrate" 320 has a eutectic/substrate-wetting enhancement layer 320 disposed on its lower surface. A copper foil 340 is disposed between the two eutectic/substrate-wetting enhancement layers 330 and is direct bonded to both of them using the direct bond process in accordance with the present invention. In this manner, a composite substrate is formed. The two substrates 320 may be the same or different materials as may be considered desirable under the circumstances. Further, while the two substrates 320 are illustrated as having planar surfaces disposed toward each other, it should be understood that the upper substrate 320 may be smaller in lateral dimensions than the lower substrate 320 and disposed in a depression or cavity in the lower substrate 320 and bonded therein by this process. Inlaid structures of this type may be desirable where the small inlaid substrate is relatively expensive and has peculiar characteristics which are desirable or necessary in isolated locations in the larger substrate or where the characteristics of the smaller substrate are needed in that location and the characteristics of the larger substrate are needed elsewhere in the structure.

Accordingly, this enhanced direct bond process may be used to form structures of any desired configuration in accordance with the intended use of the structure.

Figure 3:
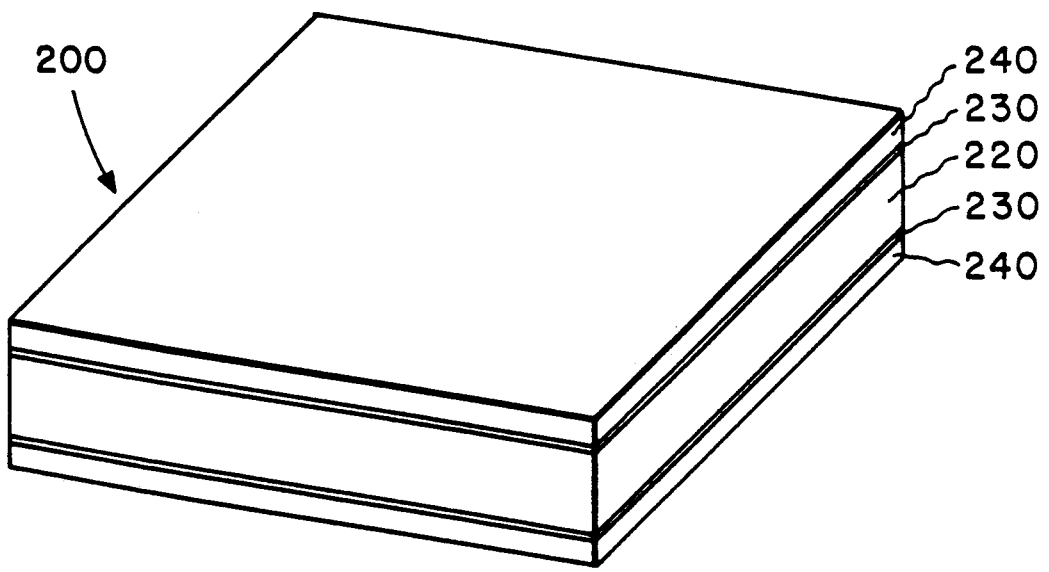
FIG. 3 is a perspective illustration of two symmetric metal foils bonded to opposed major surfaces of a single substrate via eutectic/substrate-wetting enhancement layers in combination with metal-metal compound eutectic bonds in accordance with the present invention.
Figure 5:
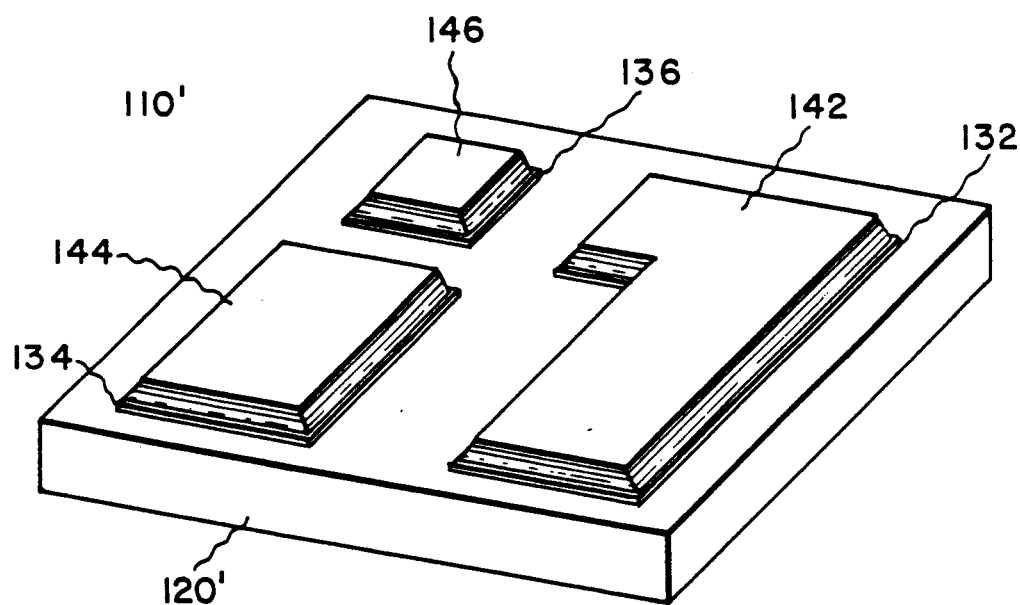
FIG. 5 is a perspective illustration of three separate metal foil segments bonded to a substrate in accordance with the present invention.
Figure 6:
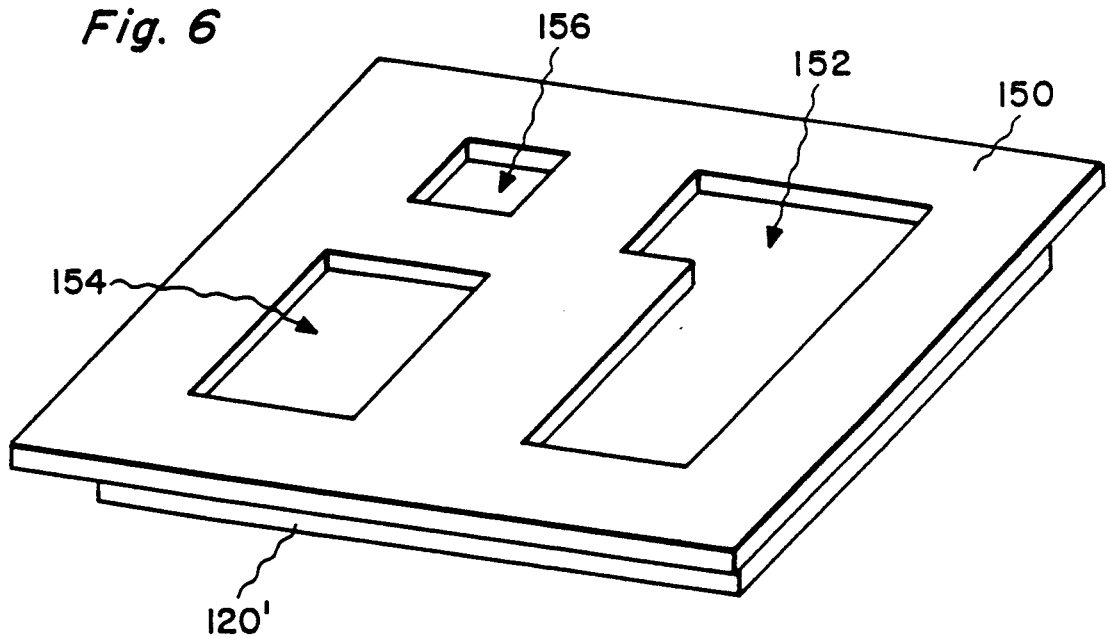
FIGS. 6, 7 and 8 illustrate successive steps in the process of forming the structure shown in FIG. 5.
Figure 7:
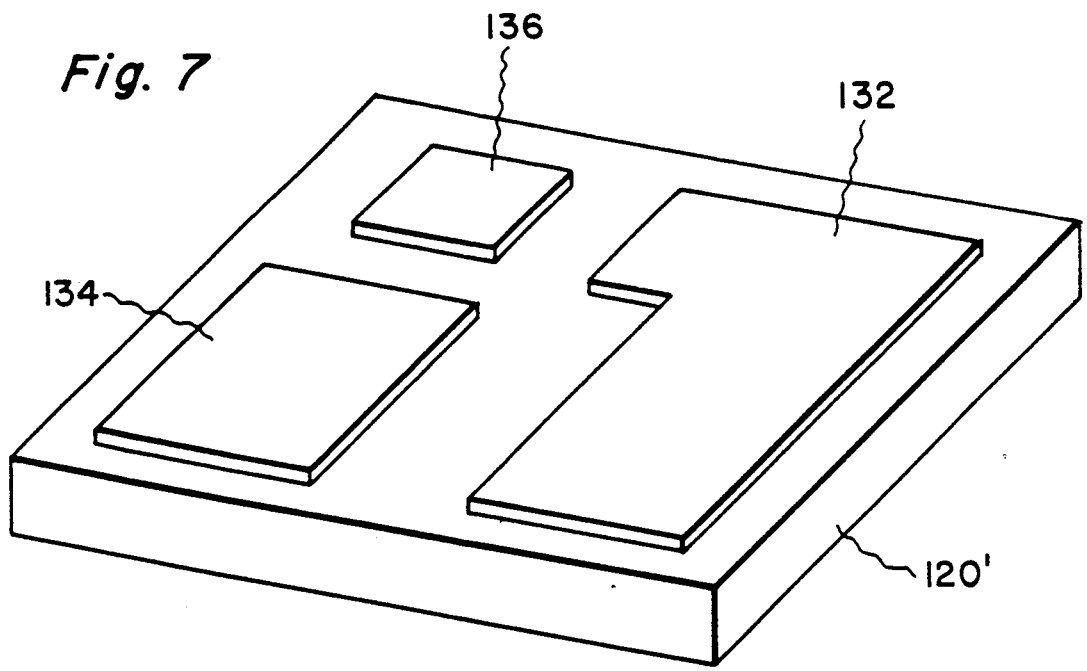
Figure 8:
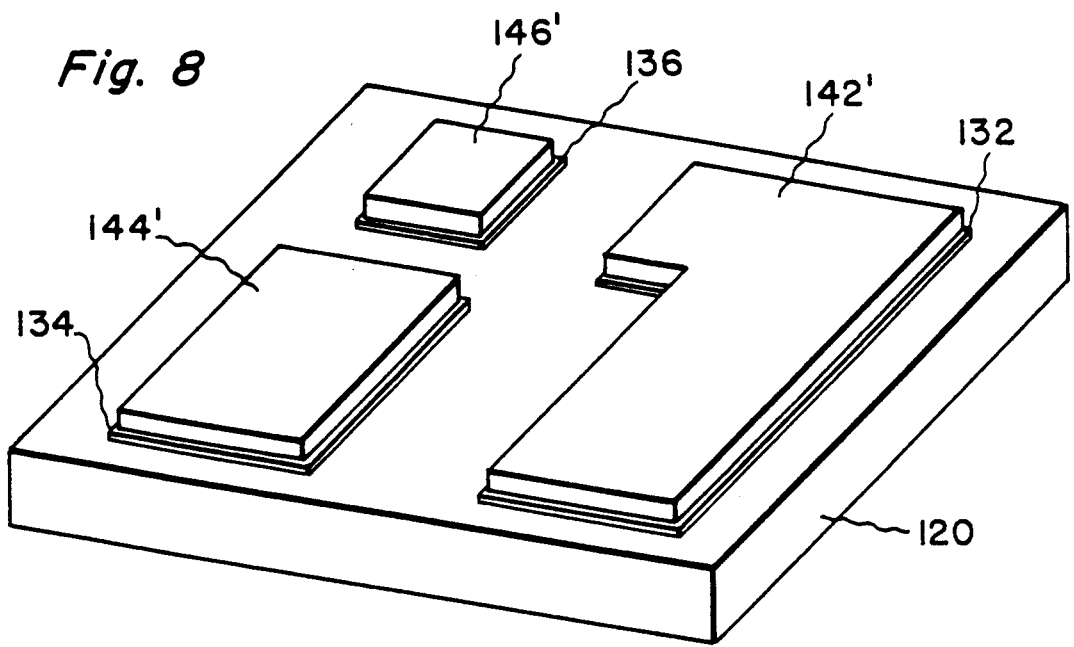

In FIGS. 2–4, the foil layer '40 is illustrated as extending across substantially the entire major surface of the substrate '20. There are many applications in which that is not desirable. For example, in producing a base for a semiconductor device package, it is often desirable to have two or more electrically isolated, laterally separated conductive members disposed on a major surface of the package component. Such a structure in accordance with the present invention is shown generally at 110' in FIG. 5. In FIG. 5, a substrate 120' has three separate eutectic/substrate-wetting enhancement layers 132, 134 and 136 disposed on its upper surface. Three separate copper foil segments 142, 144 and 146 are each aligned with and direct bonded to the corresponding wetting-enhancement layers 132, 134 and 136, respectively. A process for forming the structure of FIG. 5 is illustrated in FIGS. 6–8. First, a mask 150 is positioned over the plain or blank substrate 120' The mask 150 has three apertures 152, 154 and 156 disposed therein in the desired size and relative position for the eutectic/substrate-wetting enhancement layers 132, 134 and 136. The wetting enhancement layer material is then sputtered, evaporated or otherwise deposited through the apertures 152, 154 and 156 in the mask 150 onto the substrate 120'. This provides the desired three electrically isolated eutectic/substrate-wetting enhancement layers 132, 134 and 136 as illustrated in FIG. 7. Three conductive foil pieces 142', 144' and 146' are then prepared for direct bonding in the manner which has been described previously. These foil pieces are then disposed in proper alignment with the eutectic/substrate-wetting enhancement layers 132, 134 and 136, respectively, as shown in FIG. 8. The structure is then passed through the copper direct bond temperature profile to form the eutectic bonds between the resulting foils 142, 144 and 146 and the substrate 120' as illustrated in FIG. 5. While isolated foil segments 142', 144' and 146' are illustrated in FIG. 8, it will be understood that these foil segments may be connected together by a lead frame or other techniques well known in the package fabrication art prior to and during the direct bonding process and afterward, (or may be severed from the lead frame thereafter) as a means of ensuring that the foil layers 142, 144 and 146 are disposed in exactly the desired relative locations on the substrate 120'.

While it is preferred to pattern the eutectic/substrate-wetting enhancement layers 132, 134 and 136 through the use of a deposition mask 150, it will be recognized that a single, continuous eutectic/substrate-wetting enhancement layer may be disposed on the upper surface of the substrate 120 and the intervening portions of that layer subsequently selectively removed by an etchant such as aqua regia. In the event that electrical isolation between the copper foil segments 142, 144 and 146 is not required, a single, continuous eutectic/substrate-wetting enhancement layer may be disposed on the upper surface of the substrate 120 and the separate copper foils 142', 144' and 146' disposed thereon and bonded to the substrate by the disclosed direct bonding process. Alternatively, both the eutectic/substrate-wetting enhancement layer and the copper foil may be continuous across the substrate at the time of direct bond formation. The copper foil may then be selectively etched using photoresist or other techniques and the eutectic/substrate-wetting enhancement layer exposed by the copper etching may then be removed with an appropriate etchant such as aqua regia. This provides an ability to provide quite intricate patterns of direct bond copper on the substrate.

When the eutectic/substrate-wetting enhancement layer is sputtered onto a substrate having an aperture therein, the eutectic/substrate-wetting enhancement layer normally coats the walls of the aperture, even if the aperture is as small as 25 mils (630 microns) in diameter. When a copper foil is eutectic bonded over such an aperture, the wall of the aperture is copper colored after the direct bond copper process has been completed. This is believed to be a result of the eutectic liquid flowing down the aperture wall while the substrate is still in the liquid eutectic zone of the furnace followed by a loss of some oxygen due to the substantially oxygen-free environment in the furnace either while the substrate is still in the liquid eutectic temperature zone or before it cools substantially below that temperature. This effect may be used to enhance sealing of a lead in an aperture and for other purposes.

While many variations on the present invention have been illustrated and described, it will be recognized that many more variations can be conceived and developed without departing from the novelty of the present invention. Further, while the invention has been described primarily in terms of the copper-copper oxide eutectic direct bond process, other direct bond processes involving nickel-nickel oxide, cobalt-cobalt oxide, iron-iron oxide and copper-copper sulfide as described in the above-listed direct bond patents will also benefit from the inclusion of a eutectic/substrate-wetting enhancement layer.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. In combination:
   a substrate;
   a eutectic/substrate-wetting enhancement layer selected from the group consisting of platinum, palladium, gold and platinum, palladium or gold containing mixtures or alloys adhered to said substrate;
   a metal-metal compound eutectic selected from the group consisting of copper-copper oxide, nickel-nickel oxide, cobalt-cobalt oxide, iron-iron oxide and copper-copper sulfide bonded to said eutectic/substrate-wetting enhancement layer.

2. The combination recited in claim 1 wherein:
   said metal-metal compound eutectic is copper-copper oxide.

3. The combination recited in claim 1 further comprising:
   a further conductive member bonded to said eutectic/substrate-wetting enhancement layer by said metal-metal compound eutectic.

4. The combination recited in claim 3 wherein:
   said metal-metal compound eutectic is copper-copper oxide.

5. The combination recited in claim 4 wherein:
   said further conductive member is copper.

6. The combination recited in claim 4 wherein:
   said further conductive member is a platinum containing layer disposed on a second substrate.

7. The combination recited in claim 6 wherein: said further conductive member is platinum.

8. The combination recited in claim 3 wherein:
   said further conductive member is a second eutectic/substrate-wetting enhancement layer.

9. The combination recited in claim 8 wherein:
   said second eutectic/substrate-wetting enhancement layer is selected from the group consisting of platinum, palladium, gold and mixtures or alloys containing one of more of platinum, palladium and gold.

10. The combination recited in claim 8 wherein:
    said second eutectic/substrate-wetting enhancement layer is adhered to a second substrate.

11. The combination recited in claim 10 wherein:
    said second eutectic/substrate-wetting enhancement layer is platinum containing.

12. The combination recited in claim 11 wherein:
    said second eutectic/substrate-wetting enhancement layer is platinum.

13. The combination recited in claim 10 wherein:
    said second eutectic/substrate-wetting enhancement layer is palladium containing.

14. The combination recited in claim 11 wherein:

said second eutectic/substrate-wetting enhancement layer is palladium.

15. The combination recited in claim 10 wherein:
said second eutectic/substrate-wetting enhancement layer is gold containing.

16. The combination recited in claim 11 wherein:
said second eutectic/substrate-wetting enhancement layer is gold.

17. The combination recited in claim 1 wherein said substrate is selected from the group consisting of:
tungsten, tungsten-rhenium alloys, molybdenum, aluminum nitride, alumina, beryllia and copper.

18. The combination recited in claim 17 wherein:
said metal-metal compound is selected from the group consisting of copper-copper oxide, nickel-nickel oxide, cobalt-cobalt oxide, iron-iron oxide and copper-copper sulfide.

19. The combination recited in claim 18 wherein:
said metal-metal compound eutectic comprises copper and copper oxide.

20. The combination recited in claim 17 further comprising:
a further conductive member bonded to said eutectic/substrate-wetting enhancement layer by said metal-metal compound eutectic.

21. The combination recited in claim 20 wherein:
said further conductive member is a second eutectic/substrate-wetting enhancement layer disposed on a second substrate.

22. The combination recited in claim 21 wherein:
the first recited and said second eutectic/substrate-wetting enhancement layers are selected from the group consisting of platinum, palladium, gold and mixtures or alloys containing one or more of platinum, palladium and gold.

23. The combination recited in claim 21 wherein:
said second substrate is selected from the group consisting of tungsten, tungsten-rhenium alloys, molybdenum, aluminum nitride, alumina, beryllia and copper.

24. A symmetric laminate comprising:
a core member having first and second opposed major surfaces;
first and second eutectic/substrate-wetting enhancement layers selected from the group consisting of platinum, palladium, gold and mixtures and alloys containing one or more of platinum, palladium and gold respectively adhered to said first and second major surfaces of said core member; and
first and second symmetric copper-copper oxide eutectic layers bonded respectively to said first and second eutectic/substrate-wetting enhancement layers.

25. The symmetric laminate recited in claim 24 wherein:
said core member is tungsten.

26. The symmetric laminate recited in claim 25 wherein:
said eutectic/substrate-wetting enhancement layer is platinum containing.

27. The symmetric laminate recited in claim 26 wherein:
said eutectic/substrate-wetting enhancement layer is platinum.

28. The symmetric laminate recited in claim 25 wherein:
said eutectic/substrate-wetting enhancement layer is palladium containing.

29. The symmetric laminate recited in claim 28 wherein:
said eutectic/substrate-wetting enhancement layer is palladium.

30. The symmetric laminate recited in claim 25 wherein:
said eutectic/substrate-wetting enhancement layer is gold containing.

31. The symmetric laminate recited in claim 30 wherein:
said eutectic/substrate-wetting enhancement layer is gold.

32. The symmetric laminate recited in claim 24 wherein:
said core member is molybdenum.

33. The symmetric laminate recited in claim 24 wherein:
said core member is alumina.

34. The symmetric laminate recited in claim 24 wherein:
said core member is aluminum nitride.

35. The symmetric laminate recited in claim 24 wherein:
said core member is beryllia.

36. In combination:
a substrate having a first major surface;
a plurality of spaced apart eutectic/substrate-wetting enhancement layer segments each selected from the group consisting of platinum, palladium, gold and mixtures or alloys containing one of more of platinum, palladium and gold and adhered to said first surface of said substrate;
a plurality of metal segments, each bonded to a different one of said eutectic/substrate-wetting enhancement layer segments by a metal-metal compound eutectic comprising copper-copper oxide.

37. The combination recited in claim 36 wherein:
said metal-metal compound eutectic is copper-copper oxide.

38. The combination recited in claim 37 wherein:
said metal segments comprise copper.

39. The combination recited in claim 38 wherein:
said eutectic/substrate-wetting enhancement layers comprise platinum.

40. In combination:
a body of aluminum nitride;
a eutectic/substrate-wetting enhancement layer selected from the group consisting of platinum, palladium, gold and mixtures or alloys containing one of more of platinum, palladium and gold adhered to said aluminum nitride of said body;
a metal-metal compound eutectic comprising copper-copper oxide bonding a further member to said eutectic/substrate-wetting enhancement layer.

41. The combination recited in claim 40 wherein:
said further member comprises copper.

42. The combination recited in claim 41 wherein: said metal is copper.

43. The combination recited in claim 42 wherein:
said copper-copper oxide eutectic is native to said copper member.

44. The combination recited in claim 40 wherein:
said eutectic/substrate-wetting enhancement layer is platinum containing.

45. The combination recited in claim 40 wherein:
said eutectic/substrate-wetting enhancement is platinum.

46. The combination recited in claim 40 wherein:

said eutectic/substrate-wetting enhancement layer is palladium containing.
47. The combination recited in claim 40 wherein:
said eutectic/substrate-wetting enhancement layer is palladium.
48. The combination recited in claim 40 wherein: said eutectic/substrate-wetting enhancement layer is gold containing.
49. The combination recited in claim 40 wherein: said eutectic/substrate-wetting enhancement layer is gold.

* * * * *